United States Patent [19]

Zajac

[11] 4,431,477

[45] Feb. 14, 1984

[54] PLASMA ETCHING WITH NITROUS OXIDE AND FLUORO COMPOUND GAS MIXTURE

[75] Inventor: John Zajac, San Jose, Calif.

[73] Assignee: Matheson Gas Products, Inc., Valley Forge, Pa.

[21] Appl. No.: 510,052

[22] Filed: Jul. 5, 1983

[51] Int. Cl.³ .............. H01L 21/306; B44C 1/22; C03C 15/00; C03C 25/06
[52] U.S. Cl. ................................. 156/643; 156/646; 156/657; 156/659.1; 156/662; 204/192 E; 252/79.1
[58] Field of Search ............... 427/38, 39; 204/164, 204/192 EC, 192 E, 298; 252/79.1; 156/345, 643, 646, 655, 653, 657, 659.1, 662

[56] References Cited

U.S. PATENT DOCUMENTS 4,374,699 2/1983 Sanders et al. ............... 156/643
4,381,967 5/1983 Sanders et al. ............... 156/643

*Primary Examiner*—William A. Powell
*Attorney, Agent, or Firm*—Mark I. Feldman

[57] ABSTRACT

A process is disclosed for use in the manufacture of multilayer thin film integrated circuits for selective removal of specific layers, and a composition of matter useful in the process for selective etching of polysilicon and silicon nitrides during the manufacture of thin film integrated circuits. A multi-layer thin film integrated circuit is exposed to a plasma formed from a gaseous mixture of nitrous oxide and a fluoro compound. The nitrous oxide preferably comprises between 2.5% and 9.0% of the mixture and the fluoro compound preferably comprises between 91.0% and 97.5% of the mixture.

19 Claims, 2 Drawing Figures

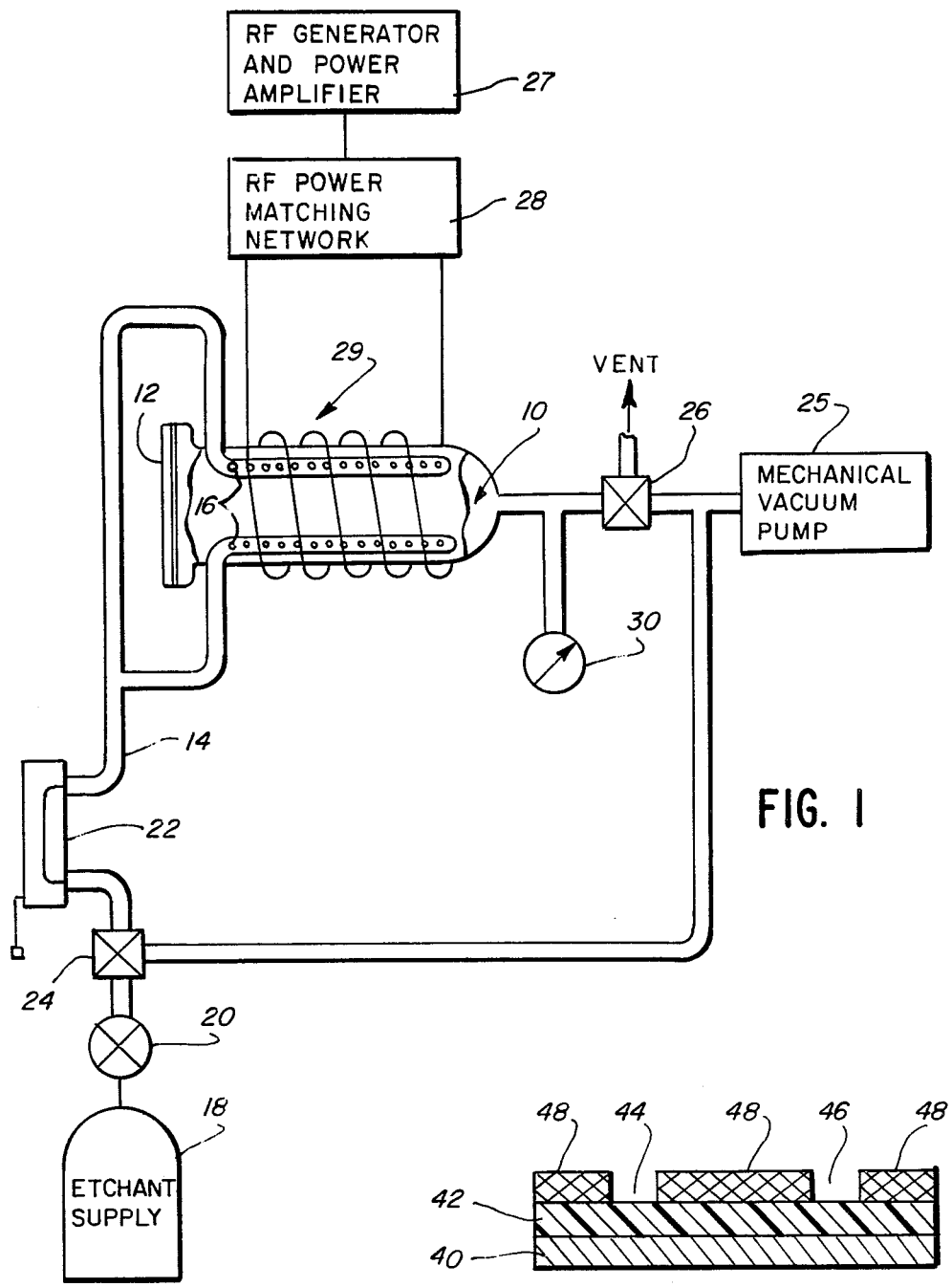

PLASMA ETCHING WITH NITROUS OXIDE AND FLUORO COMPOUND GAS MIXTURE

FIELD OF THE INVENTION

This invention relates in general to a process and material useful in analytical procedures and, more particularly, to a process and material useful in the manufacture of semiconductor integrated circuits for providing preferential etching of polysilicon and silicon nitrides in comparison to the etching of silicon dioxides.

BACKGROUND OF THE INVENTION

In one conventional technique for the manufacture of thin film integrated circuits, a relatively thin layer of patterned insulating dielectric film is grown or deposited on one or both surfaces of a slice of semiconductor material. To define those areas on the semiconductor slice where it is desired to generate semiconductor features, a layer of photoresist material is spun on to the insulating layer, and is subsequently exposed through a mask.

After exposure of the photoresist material through the mask, the layer of photoresist is developed and processed by means of a suitable solvent, exposing select areas of the underlying layer. A wet acid-based dip is then used to etch the insulating layer from the surface of the semiconductor slice in the exposed areas, the remaining photoresist material serving as an etch-mask for the surface covered by it. Following the wet etching process, a water rinse and a drying step are implemented. The remainer of the photoresist material is subsequently removed, followed by an acid dip required for the removal of inorganic residues.

There are a number of disadvantages with the etching step used in this particular technique, including physical degradation of a photoresist etch mask; finite chemical degradation of a metallic etch mask; enhanced undercutting effects creating undesirable slopes of the etched channel; severe chemical degradation of underlying layers; required post-etch water rinse and drying steps which reduce production yields; short shelf-life of etching solution due to contamination; and it is generally very hazardous to personnel and undesirably polluting.

In an attempt to overcome these problems, other prior art techniques utilize a gas mixture for the generation of a plasma. For example, U.S. Pat. No. 4,028,155 to Jacob discloses a plasma process and material for chemically etching a metal, wherein the gaseous plasma is formed from a mixture of oxygen, a halogen containing gas selected from designated groups, and a halocarbon vapor or gas having no more than two carbon atoms per molecule with at least one of the carbon atoms linked to a predominance of chlorine atoms. The inclusion of oxygen in the mixture is disadvantageous, however, because the oxygen actively combines with and etches the organic photoresist. The loss of photoresist is undesirable.

U.S. Pat. No. 3,518,132 to Glendinning is directed to a vapor etching process wherein the combined vapors of hydrogen fluoride and of nitrous oxide are applied to a metallic surface causing corrosion. The corrosion is then dissolved in sodium hydroxide leaving an etched surface. However, this patent relates to vapor and liquid etching as opposed to plasma etching. Moreover, hydrogen fluoride is a corrosive, toxic acid that is difficult to handle and would not be expected to have the same properties as fluorocarbons which are inert and non-toxic.

U.S. Pat. No. 4,292,153 to Kudo et al. discloses a method for processing substrate material by plasma treatment in a reaction chamber, having the steps of mounting the substrate materials onto a series of electrode plates arranged in parallel to each other, connecting alternate ones of the electrode plates to alternate ones of a pair of bus lines, applying high-frequency power between the pair of bus lines for producing plasma between the electrode plates, and changing the feedpoints of the high-frequency power on the pair of bus lines so that the plasma treatment is effected substantially uniformly in the spaces between the electrode plates. The patent discloses the use of a reaction gas of nitrous oxide, nitrogen, monosilane, ammonia, or carbon tetrafluoride, but there is no suggestion that the nitrous oxide and carbon tetrafluoride be combined and used as a mixture without any other gaseous components.

U.S. Pat. Nos. 4,209,349, 4,243,475 and 4,264,382 disclose processes wherein nitrous oxide is used in methods for depositing silicon dioxide, and not for etching silicon dioxide. Also, these patents do not disclose the use of fluorocarbons.

U.S. Pat. Nos. 4,028,155, 3,951,709, 3,951,843, 3,867,216 and 3,654,108 relate to etching with fluorocarbons, but do not discuss the use of nitrous oxide as a component in the gas mixture.

SUMMARY OF THE INVENTION

The foregoing disadvantages of the prior art are overcome in accordance with the present invention which relates to a process for use in the manufacture of multilayer thin film integrated circuits for selective removal of specific layers, and a composition of matter useful in the process for selective etching of silicon and silicon nitrides during the manufacture of thin film integrated circuits.

The process comprises the steps of exposing the multi-layer thin film integrated circuit to a plasma formed from a gaseous mixture of nitrous oxide and a fluoro compound.

The composition of matter comprises a gaseous mixture of nitrous oxide and a fluoro compound, at least one fluorine atom per molecule, wherein the nitrous oxide preferably comprises between 2.5% and 9.0% of the mixture and the fluoro compound preferably comprises between 91.0% and 97.5% of the mixture, exclusive of diluents. The use of diluents such as helium, argon, neon, nitrogen, carbon monoxide, etc., would have little affect except on temperature and uniformity.

The gaseous mixture provides the desired etching of pure silicon, silicon oxides and silicon nitrides while minimizing the undesirable etching and loss of photoresist material.

BRIEF DESCRIPTION OF THE DRAWING

In the drawing

FIG. 1 is a schematic illustration of a reactor system useful in the process of this invention; and FIG. 2 is a cross-sectional view of a typical thin film structure at an intermediate stage of the manufacturing process.

DETAILED DESCRIPTION OF THE PREFERRED EMBODIMENT

While this invention is susceptible of embodiment in many different forms, there is shown in the drawing and will herein be described in detail one specific embodiment, with the understanding that the present disclosure is to be considered as an exemplification of the principles of the present invention, and is not intended to limit the invention to the embodiment illustrated.

Referring now to the drawing, FIG. 1 depicts diagrammatically an apparatus performing the process described in the invention. The apparatus includes a reactor chamber 10 having a cover 12 and a gas inlet manifold 14. The side of the reactor 10 has been partially broken away in the drawing so as to better illustrate the gas diffusion tubes 16 which are disposed therein and are externally connected to manifold 14. Such a reactor is disclosed in U.S. Pat. No. 3,619,402.

A pressurized etchant supply 18 is connected through a pressure regulating valve 20, a three-way solenoid valve 24, and a flowmeter 22 to manifold 14. The etchant supply is a gaseous mixture comprised of nitrous oxide and a fluoro compound, as described below. A vacuum gauge 30 provides an indication of total reaction pressure in reactor 10.

At any time, and prior to introduction of the gas mixture to manifold 14, the corresponding flow lines are constantly evacuated through the three-way solenoid valve 24 leading to the mechanical vacuum pump 25, this being the case also under conditions where air at atmospheric pressure prevails in reactor 10 through the utilization of the three-way isolation valve 26. A source of radio frequency power 27 provides exciting energy through a matching network 28 to coil 29 which surrounds reaction chamber 10. Preferably, inductor 29 consists of a multiturn coil having two coil sections whose respective coil turns are wound in opposite directions, as disclosed in U.S. Pat. No. 3,705,091. Although the gaseous mixture is preferably premixed and supplied to the reactor from a single container 18, it will be apparent that the nitrous oxide and fluoro compound gases may, if desired, be supplied from separate sources via separate flow lines and mixed within either manifold 14 or reactor 10. In operation, the gaseous mixture is admitted to reaction chamber 10 where the inductively coupled radio frequency energy creates a cold plasma. Such a reaction system is commercially available from the Process Control Division of LFE Corporation, under the trade designation PDE-301 or PDE-504. Other types of reactors are available using capacitive coupling.

The general process is one in which a plurality of semiconductor devices, at an appropriate state of the manufacturing process, are placed in reactor 10 and exposed to the plasma generated by the admission of a gaseous mixture of nitrous oxide and a fluoro compound.

For the appropriate reactions to take place, the reaction chamber is evacuated prior to the admission of the gaseous etchant. The process provides controllable and uniform etching of dielectric films for a production batch of semiconductor devices with negligible loss of organic photoresist etch mask.

In FIG. 2 there is shown in cross-sectional view a portion of a typical semiconductor device at a suitable processing stage for the utilization of this invention. The semiconductor device consists of a semiconductor material 40, such as silicon, having a relatively thin (200 to 10,000 A) layer of dielectric material 42 (e.g., Si, $SiO_2$, or $SiN_4$) either deposited or thermally grown onto it. This dielectric layer 42 is to be etched at the openings 44 and 46 in the overlying photoresist mask 48. These openings or windows in the etch mask 48 may represent fractional areas ranging from less than 1 percent up to about 99 percent of the total area of the semiconductor slice.

If the semiconductor device, as depicted in FIG. 2, is exposed to the prescribed plasma formed from a gaseous mixture of nitrous oxide and fluoro compound, the photoresist material will stay intact while the exposed dielectric field 42 will be etched down to the semiconductor layer 40 in openings (44 and 46).

The gas mixture comprises nitrous oxide together with one or more fluoro compounds, preferably a halocarbon, wherein each halocarbon has at least one fluorine atom per molecule. Acceptable halocarbons include fluorocarbons such as $CF_4$, $C_2F_6$, $C_3F_8$, $C_4F_8$, $C_5F_{10}$ and $C_5F_8$. Carbon tetrafluoride ($CF_4$) is the most commonly used and preferred fluoro compound for use with the nitrous oxide. Chlorofluorocarbons may also be used, such as $C_2Cl_2F_2$, $C_2Cl_3F$, $C_2ClF_3$, $C_2ClF_5$, $C_2Cl_2F_4$, $C_2Cl_3F_3$, $C_2Cl_4F_2$, $C_2Cl_5F$, $CCl_3F$, $CCl_2F_2$, and $CClF_3$. Other fluoro gases including but not limited to the inorganic gases $SF_6$, $NF_3$, $SF_4$, $SO_2F_2$, $SiF_4$, and $PF_5$ may also be used.

The preferred combination of the gaseous components is a mixture of 2.5% to 9.0% of nitrous oxide, with the remaining percentage of 91.0% to 97.5% comprising the fluoro compound. The most preferred range is 6.0% to 8.0% nitrous oxide and 94.0% to 96.0% of the fluoro compound. Of course, the fluoro compound may comprise a single fluoro compound or a mixture of two or more of such fluoro compounds.

EXAMPLE 1

Tests were conducted on a Plasma Reactor Model PDS-302 (LFE Corp., Waltham, Mass.) under the following operating conditions:

| | |
|---|---|
| Total chamber pressure | 1 Torr |
| RF input power | 100 watts |
| Total gas flow | about 100 cc per minute |
| Etching time | 5 minutes |
| Negative photoresist | 0.8 microns thick |
| Wafers | 111 pure silicon |

A pattern was applied to new silicon wafers using photoresist. The flow rates were measured with Brooks glass tube flowmeters corrected for gas specific gravity.

Pure $CF_4$ was tested and exhibited a low etching rate and little photoresist removal. When nitrous oxide was mixed with the $CF_4$, the addition of 2.5% $N_2O$ increased the etching rate to an acceptable level while also increasing the photoresist removal. Additional $N_2O$ further increased the etching rate, up to an optimum concentration with the fastest etching rate at about 6% to 8% $N_2O$ in 92% to 94% $CF_4$, by flow. The etching rate was acceptable up to about 9% $N_2O$. The photoresist removal increased as the percentage of $N_2O$ increased, and was within acceptable amounts up to about 9% $N_2O$.

In comparing a 94% $CF_4$ and 6% $N_2O$ mixture with a conventional mixture of 96% $CF_4$ and 4% $O_2$, the former etched silicon about 25% deeper in a given time period, and removed about 25% more photoresist material.

EXAMPLE 2

Comparative Tests were conducted with mixtures of 94% $CF_4$ and 6% $N_2O$, and a mixture of 96% $CF_4$ and 4% $O_2$. The results are tabulated as follows:

| Materials | Etch Rate with $CF_4/N_2O$ (94%/6%) | Etch Rate with $CF_4/O_2$ (96%/4%) |
|---|---|---|
| $Si_3N_4$ | 212 angstroms/min. | 217 angstroms/min. |
| Photoresist (AZ1350J) | 45 angstroms/min. | 95 angstroms/min. |
| $SiO_2$ | 50 angstroms/min. | 50 angstroms/min. |
|  | Selectivity with $CF_4/N_2O$ (94%/6%) | Selectivity with $CF_4/O_2$ (96%/4%) |
| $Si_3N_4$:Photoresist | 4.7:1 | 2.3:1 |
| $Si_3N_4$:$SiO_2$ | 4.24:1 | 4.34:1 |

The foregoing data in Example 2 shows that the $CF_4$ and $N_2O$ mixture demonstrated comparable or better results than the conventional $CF_4$ and $O_2$ mixture. There was significantly less removal of the photoresist material.

The data on selectivity shows the ratio of the amount of etching of $Si_3N_4$ as compared to the photoresist material. For these materials, the selectivity ratio should be at least 2.3:1, which is the standard of the industry. The selectivity of the $CF_4$ and $N_2O$ gas mixture is far in excess of this minimum ratio.

The selectivity ratio of $Si_3N_4$:$SiO_2$ is useful for determining whether one could selectively etch the $Si_3N_4$ while not etching the $SiO_2$. A ratio of at least 2:1 is necessary in order to accomplish selective etching, and the $CF_4/N_2O$ mixture is well above the minimum level and is comparable to the $CF_4$ and $O_2$ mixture.

The mechanism involved in accomplishing the etching is not well understood but it is believed that the gas mixture increases the amount of fluorine that is available to accomplish the etching.

From the foregoing, it will be observed that numerous variations and modifications may be affected without departing from the true spirit and scope of the novel concept of the invention. It is to be understood that no limitation with respect to the invention illustrated and described herein is intended or should be inferred. It is, of course, intended to cover by the appended claims all such modifications as fall within the scope of the claims.

I claim:

1. A process for use in the manufacture of multi-layer thin film integrated circuits for selective removal of specific layers, comprising the step of:
    exposing the multi-layer thin film integrated circuit to a plasma formed from a gaseous mixture of nitrous oxide and a fluoro compound, exclusive of any dilutents.

2. A process as defined in claim 1 wherein the nitrous oxide comprises from 2.5% to 9.0% of said mixture.

3. A process as defined in claim 1 wherein the nitrous oxide comprises from 6.0% to 8.0% of said mixture.

4. A process as defined in claim 1 wherein said mixture includes two or more fluoro compounds.

5. A process as defined in claim 1 wherein said fluoro compound comprises a halocarbon.

6. A process as defined in claim 5 wherein said fluoro compound comprises a halocarbon containing chlorine.

7. A process as defined in claim 5 wherein said fluoro compound comprises carbon tetrafluoride.

8. A process as defined in claim 1 wherein said fluoro compound comprises an inorganic halide.

9. A composition of matter useful in the process for selective etching of poly silicon and silicon nitrides during the manufacture of thin film integrated circuits, comprising:
    a gaseous mixture of nitrous oxide and a fluoro compound, wherein the nitrous oxide comprises between 2.5% and 9.0% of the mixture and the fluoro compound comprises between 91.0% and 97.5% of the mixture, exclusive of any dilutents.

10. A composition of matter as defined in claim 9 wherein the mixture includes a single fluoro compound.

11. A composition of matter as defined in claim 9 wherein the mixture includes two or more fluoro compounds.

12. A composition of matter as defined in claim 9 wherein the nitrous oxide comprises between 6.0% and 8.0% of the mixture and the fluoro compound comprises between about 92% and 94% of the mixture.

13. A composition of matter as defined in claim 9 wherein said fluoro compound comprises a halocarbon.

14. A composition of matter as defined in claim 6 wherein the fluoro compound comprises carbon tetrafluoride.

15. A composition of matter as defined in claim 13 wherein said fluoro compound comprises a halocarbon containing chlorine.

16. A composition of matter as defined in claim 9 wherein said fluoro compound comprises an inorganic halide.

17. A composition of matter as defined in claim 12 wherein the inorganic halide comprises carbon tetrafluoride.

18. A composition of matter as defined in claim 12 wherein the inorganic halide comprises sulfur hexafluoride.

19. A composition of matter as defined in claim 12 wherein the inorganic halide comprises nitrogen trifluoride.

* * * * *